United States Patent [19]

Bischoff et al.

[11] 4,355,082
[45] Oct. 19, 1982

[54] ULTRA-THIN WIRE FOR SEMICONDUCTOR CONNECTIONS

[75] Inventors: Albrecht Bischoff, Bruchköbel; Fritz Aldinger, Rodenbach, both of Fed. Rep. of Germany

[73] Assignee: W. C. Heraeus GmbH, Hanau, Fed. Rep. of Germany

[21] Appl. No.: 274,528

[22] Filed: Jun. 17, 1981

[30] Foreign Application Priority Data

Jun. 24, 1980 [DE] Fed. Rep. of Germany ....... 3023528

[51] Int. Cl.$^3$ ............................................ H10L 23/48
[52] U.S. Cl. .................... 428/607; 428/620; 428/652; 428/923; 357/67; 29/589; 29/590; 29/591
[58] Field of Search ................. 428/620, 652, 607; 357/67; 29/589, 590, 591

[56] References Cited

U.S. PATENT DOCUMENTS

| | | | |
|---|---|---|---|
| 3,306,716 | 2/1967 | Adler | 428/652 |
| 3,716,469 | 2/1973 | Bhatt et al. | 357/67 |
| 3,967,013 | 6/1976 | Danis | 428/652 |
| 4,004,892 | 1/1976 | Vlam | 428/652 |
| 4,024,567 | 5/1977 | Iwata et al. | 357/67 |
| 4,151,545 | 4/1979 | Schnepf et al. | 357/67 |

OTHER PUBLICATIONS

A. Bischoff et al., Metallkundliche Aspekte bei Verabeitung und Einsatz von Feinstdrähten in der Halbleitertechnik, Draht 31, 1980, Seiten 128 bis 131.
H. Thiede et al., Characterizing Fine Wire for Thermocompression and Ultrasonic Bonding, Proceedings of the 1979 International Microelectronics Symposium.
A. Bischoff, Properties and Metallurgical Aspects of Wires Used for Bonding, Proceedings of the Technical Programme Internepcon U.K., 1980.
F. d'Heurle et al., Improving Resistance to Electromigration of Al.Cu Strips IBM Technical Disclosure Bull., 1979, vol. 13, No. 9, Feb. '71.

Primary Examiner—Veronica O'Keefe
Attorney, Agent, or Firm—Frishauf, Holtz, Goodman & Woodward

[57] ABSTRACT

To prevent metal fatigue, particularly when making a button loop, or nail head thermo compression bond connection to a semiconductor, the connecting wire has a core of copper, or a copper alloy of at least 60% copper content, and a jacket of aluminum, or aluminum alloy, of at least 95% aluminum content; in a preferred form, the core is 94% copper and 6% tin, and the jacket is, for example, 99% aluminum, 1% silicon; 96% aluminum, 4% copper; or 99% aluminum, 1% magnesium, all percentages by weight.

10 Claims, 2 Drawing Figures

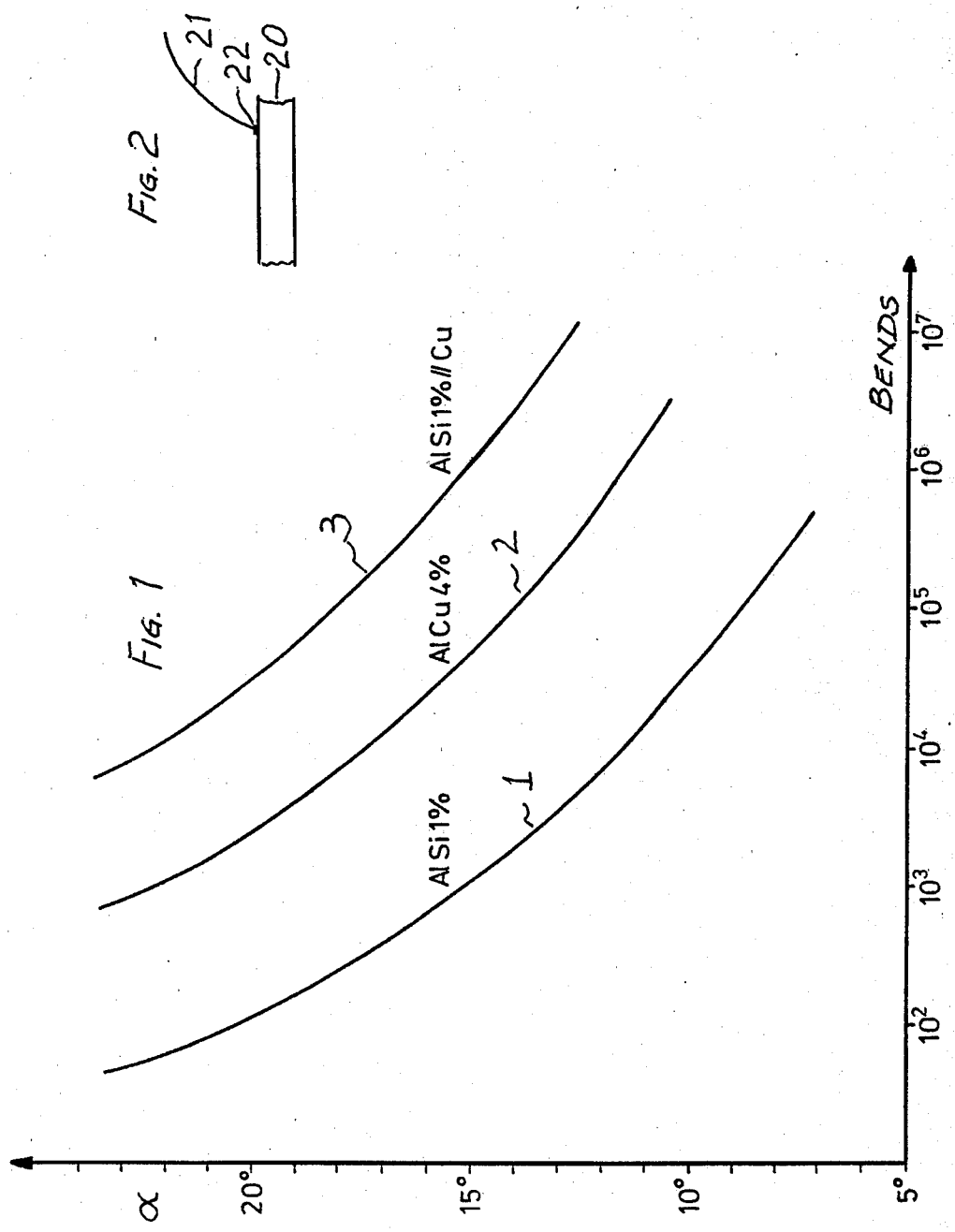

ULTRA-THIN WIRE FOR SEMICONDUCTOR CONNECTIONS

The present invention relates to an ultra-thin wire to make connections to semiconductor elements or structures, for example on crystals of semiconductor material, such as silicon semiconductor crystals.

BACKGROUND

The lead connections from semiconductor elements formed on semiconductor crystals are extremely thin and thus the connecting wires must meet rigorous requirements to permit them to be securely connected or bonded to the semiconductor element or terminal track on a crystal, and yet be mechanically strong and reliable to insure electrical as well as mechanical integrity of the connection.

Connecting wires of the type to which the present invention relates have diameters in the order of between about 0.01 to 0.06 mm. Usually, terminal connecting wires were made of gold, aluminum, or aluminum alloys such as AlSi1, AlCu4 or AlMg1. The wires are usually bonded to the semiconductor by ultrasonic welding or thermo compression welding, or by a combination of both welding processes, known as thermosonic welding. Known aluminum and aluminum alloy ultra-thin wires are well suited for ultrasonic welding, but there is a tendency to form fissures in the region of the wire between the bonding point and the so called loop due to metal fatigue.

Known aluminum and aluminum alloy ultra-thin wires can be used as bonding wires in the thermo compression or thermosonic welding methods according to the process of the nail head or button termination only in a limited way. Other than ultra-thin gold wires, the region of the aluminum wires which is close to the bonding point tends to crack when making the loop formation.

THE INVENTION

It is an object to provide an ultra-thin bonding or connecting wire, particularly for semiconductor bonding, which does not utilize noble metals but which has, nevertheless, high mechanical strength, is resistant to metal fatigue failure, and can be used in accordance with the button or nail head contact welding connecting process without danger of failure.

Briefly, in accordance with the invention, the ultra-thin wire of a diameter in the order of between about 0.01 to 0.06 mm, has a core which is made of copper or a copper alloy, and a jacket made of aluminum or an aluminum alloy, in which—with all percentages being by weight—the core has at least about 60% copper content and the jacket has at least about 95% aluminum content.

DRAWING

FIG. 1 is a diagram of bending angle (ordinate) vs. number of test bends (abscissa); and FIG. 2 is a highly schematic fragmentary side view of a silicon chip having a wire bonded to a surface thereof.

FIG. 2 shows a silicon chip 20 having a surface conductive track thereon, not visible in the drawing because it is so thin, to which a bonding wire 21 is attached by a bonding point 22. Prior to connect actually the bonding wire 21 to a terminal or lead (not shown), the loop formation occurs.

In the disclosure and discussion that follows, all percentages given will be percentages by weight.

The wire 21 has a core made of copper or a copper alloy; suitable copper alloy cores are brass, bronze, or argentan, or German silver, that is, a copper-nickel-zinc alloy, insofar as the respective alloys contain at least 60% copper. A particularly suitable alloy for the core is 94% copper and 6% tin.

Particularly suitable aluminum alloys for the jacket are:

99% aluminum and 1% silicon
96% aluminum and 4% copper
99% aluminum and 1% magnesium.

Preferred ultra-thin wires are as follows:

| Core | Jacket |
|---|---|
| (1) copper | aluminum |
| (2) copper | alloy, 99% Al, 1% Si |
| (3) copper | alloy, 96% Al, 4% Cu |
| (4) copper | alloy, 99% Al, 1% Mg |
| (5) alloy, 94% copper, 6% Sn | aluminum |
| (6) alloy, 94% Cu, 6% Sn | alloy, 99% Al, 1% Si. |

FIG. 1 illustrates the Wöhler curves from which there can be seen that the fatigue resistance is excellent. As a measure for fatigue resistance, the number of bends of an ultra-thin wire has been selected, having a diameter of 0.05 mm, and a copper core with a jacket of Al-Si1—see curve 3. For comparison, similar curves are drawn of known wires made of AlSi1, see curve 1, and AlCu4, see curve 2. The wires, again, had the same diameter of 0.05 mm. The copper—AlSi1 jacketed ultra-thin wire has a bending fatigue resistance which exceeds that of the AlCu4 wire, curve 2, by about 10 times that of the AlCu4 wire and, about 100 times that of the AlSi1 wire.

The danger of formation of fissures in the region between the bond point and the wire is thus substantially decreased since the resistance against fatigue is effectively improved.

The ultra-thin wires, preferably, have a diameter in the order of about 0.025 mm, of which the core, preferably, has a diameter in the order of about 0.01 to 0.015 mm.

Semiconductors, such as silicon semiconductors 20 (FIG. 2), can be connected by the bonding wires in various processes, for example by ultrasonic welding in accordance with the wedge-wedge process, as well as by the button head or nail head termination process.

A particularly important field of use of the ultra-thin wires is the formation of contacts of silicon semiconductors which have an aluminum layer of aluminum track thereon in accordance with the nail head or button head contacting process. The silicon which is metallized with aluminum can be contacted with the known aluminum and aluminum alloy wires only in a limited way when using automatic welding apparatus; gold bonding wires permit automatic termination and bonding, but gold is expensive and, additionally, the welding heat due to thermo compression forms a brittle intermetallic gold-aluminum compound ($AuAl_2$). The present invention provides a wire which permits reliable and long-term connection of bonding wires without danger of failure due to metal fatigue or breakage.

REFERENCE TO RELATED PUBLICATIONS

1. A. Bischoff und H. Thiede, "Metallkundliche Aspekte bei Verarbeitung und Einsatz von Feinstdrähten in der Halbleitertechnik," Draht 31 (1980), Seiten 128 bis 131
2. H. Thiede und A. Bischoff, "Characterizing fine wire for thermocompression and ultrasonic bonding," Proceedings of the 1979 International Microelectronics Symposium
3. A. Bischoff, "Properties and metallurgical aspects of wires used for bonding," Proceedings of the Technical Progamme Internepcon U.K. '80

We claim:

1. Ultra-thin bonding wire, particularly for connection to a semiconductor, and having a diameter in the order of about 0.01 to 0.06 mm
    comprising, in accordance with the invention,
    a core of a material of the group consisting of: copper; copper alloy of at least 60% copper content;
    and a jacket of a material of the group consisting of: aluminum, or aluminum alloy of at least 95% aluminum;
    all percentages by weight.

2. Wire according to claim 1, wherein the core comprises an alloy of 94% copper and 6% tin.

3. Wire according to claim 1, wherein the jacket comprises an alloy of 99% aluminum and 1% silicon.

4. Wire according to claim 1, wherein the jacket comprises an alloy of 96% aluminum and 4% copper.

5. Wire according to claim 1, wherein the jacket comprises an alloy of 99% aluminum and 1% magnesium.

6. Wire according to claim 1, wherein the core comprises copper, and the jacket comprises aluminum.

7. Wire according to claim 1, wherein the core comprises copper, and the jacket comprises an alloy of the group consisting of:
    99% aluminum and 1% silicon;
    96% aluminum and 4% copper;
    99% aluminum and 1% magnesium.

8. Wire according to claim 1, wherein the core comprises an alloy of 94% copper and 6% tin;
    and the jacket comprises a material of the group consisting of: aluminum, or an alloy of 99% aluminum and 1% silicon.

9. In combination with a semiconductor silicon substrate (20) having a metallic surface formed thereon,
    a bonding wire bonded to the metallic surface on the silicon substrate, as claimed in claim 1.

10. The combination of claim 9, wherein the metallic surface comprises aluminum;
    and the bonding wire comprises a wire having a core of a material of the group consisting of: copper, a copper alloy of at least 60% copper content; and a jacket comprising an alloy of the group consisting of:
    99% aluminum and 1% silicon;
    96% aluminum and 4% copper;
    99% aluminum and 1% magnesium.

* * * * *